(12) United States Patent
Yano et al.

(10) Patent No.: US 6,924,236 B2
(45) Date of Patent: Aug. 2, 2005

(54) MANUFACTURING METHOD OF SEMICONDUCTOR DEVICE

(75) Inventors: Hiroyuki Yano, Yokohama (JP); Katsuya Okumura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 09/870,085

(22) Filed: May 30, 2001

(65) Prior Publication Data

US 2001/0051432 A1 Dec. 13, 2001

(30) Foreign Application Priority Data

May 31, 2000 (JP) ........................................ 2000-163045

(51) Int. Cl.[7] ............................................ H01L 21/302
(52) U.S. Cl. .................... 438/692; 438/243; 438/386; 438/692
(58) Field of Search ................................ 438/690, 691, 438/692, 745, 747, 748, 749, 750, 754, 756, 757, 243, 244, 386, 387

(56) References Cited

U.S. PATENT DOCUMENTS

| | | | |
|---|---|---|---|
| 5,426,073 A | | 6/1995 | Imaoka et al. |
| 5,578,516 A | * | 11/1996 | Chou .......................... 438/253 |
| 5,795,804 A | * | 8/1998 | Jenq ........................... 438/244 |
| 6,016,265 A | | 1/2000 | Yoshida et al. |
| 6,265,314 B1 | * | 7/2001 | Black et al. ................. 438/690 |
| 6,267,649 B1 | | 7/2001 | Lai et al. |
| 6,291,315 B1 | * | 9/2001 | Nakayama et al. ......... 438/459 |
| 2001/0029150 A1 | | 10/2001 | Kimura et al. |

FOREIGN PATENT DOCUMENTS

| | | |
|---|---|---|
| JP | 62-154614 | 7/1987 |
| JP | 2-100319 | 4/1990 |
| JP | 5-329759 | 12/1993 |

\* cited by examiner

*Primary Examiner*—Craig A. Thompson
*Assistant Examiner*—Thanhha Pham
(74) *Attorney, Agent, or Firm*—Frommer Lawrence & Haug LLP

(57) ABSTRACT

The present invention provides a method of manufacturing a semiconductor device, comprising the step of selectively grinding or polishing the peripheral portion and the beveled portion of a target substrate including a semiconductor substrate. The grinding or polishing of the target substrate is performed after the dry etching step for forming a trench in the target substrate, or after the depositing step of a copper layer providing a source of contamination of the process apparatus in forming a Cu-buried wiring. By grinding or polishing the peripheral portion and the beveled portion of the target substrate, the uneven portion in the peripheral portion and the beveled portion can be removed and copper is prevented from being exposed to the outside, thereby avoiding the particle generation and contamination of the process apparatus.

26 Claims, 8 Drawing Sheets

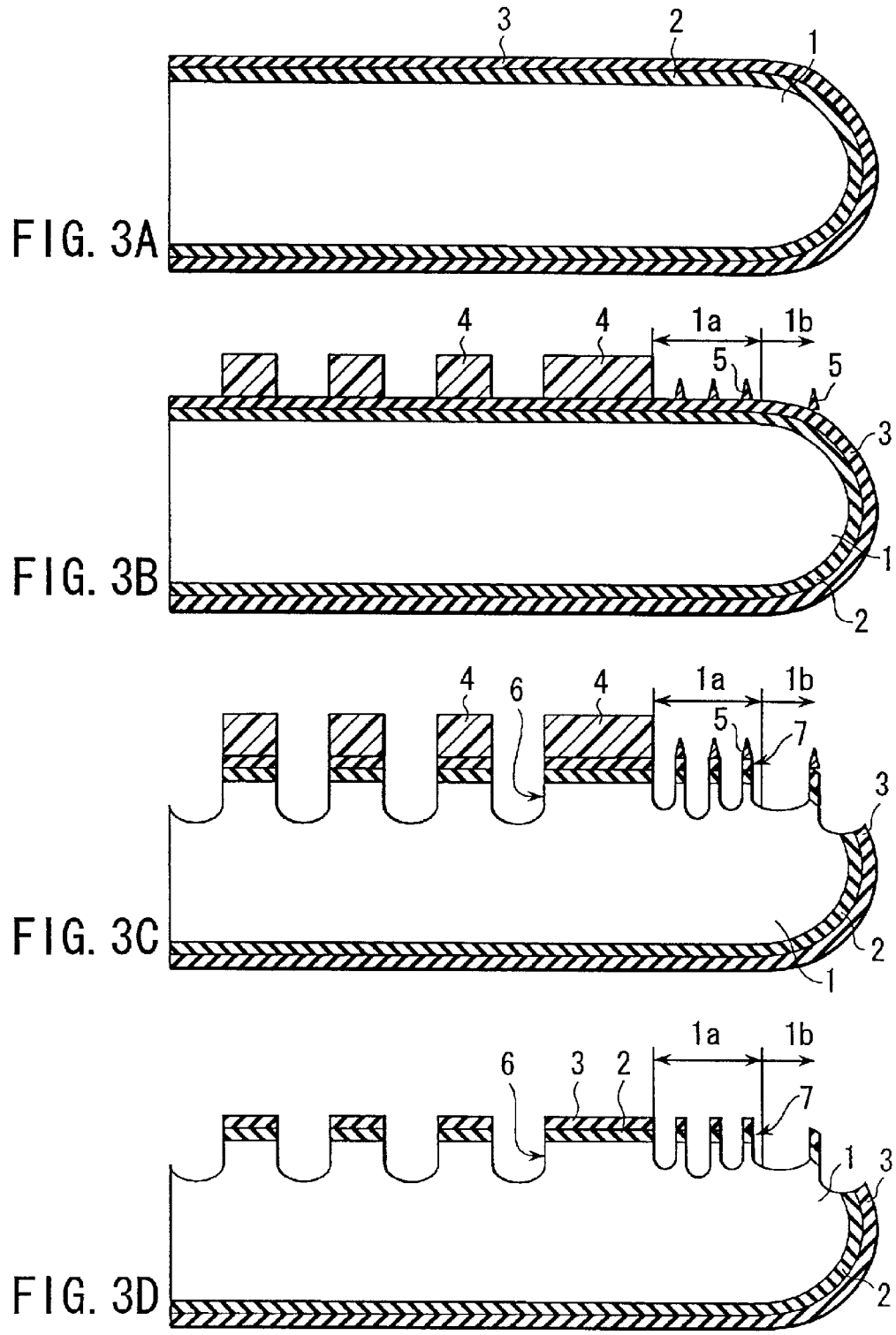

MANUFACTURING METHOD OF SEMICONDUCTOR DEVICE

CROSS-REFERENCE TO RELATED APPLICATIONS

This application is based upon and claims the benefit of priority from the Japanese Patent Application No. 2000-163045, filed May 31, 2000, the entire contents of which are incorporated herein by reference.

BACKGROUND OF THE INVENTION

The present invention relates to a method of manufacturing a semiconductor device having uneven portions such as a trench capacitor and a damascene wiring, in which the particle generation causing the manufacturing yield of the semiconductor device to be lowered is suppressed by grinding or polishing the peripheral portion and beveled portion on the main surface of a target substrate such as a semiconductor substrate, and the contamination of the semiconductor substrate and the processing machine by the filled metal in the metallization trench such as a copper trench is suppressed.

With the rapid progress achieved in recent years in the degree of integration and performance of the semiconductor integrated circuit, it is of high importance to develop an SOC (System On Chip) having a DRAM (Dynamic Random Access Memory) section of a high degree of integration and a logic section formed on the same chip, said DRAM section including a trench capacitor and said logic section having a multi-layered metallization of a damascene structure in which a metal having a high electrical conductivity such as copper is buried in a wiring groove.

However, in the manufacturing process of the SOC, it is necessary to form a large number of trenches having a high aspect ratio for forming the trench capacitor in the DRAM section, and it is necessary to form a large number of wiring grooves connected to each other via contact holes having a high aspect ratio for forming a multi-layered wiring of a damascene structure in the logic section.

In the manufacturing process of an LSI having a large number of uneven portions, particularly, in forming the peripheral portion and beveled portion on the main surface of the semiconductor device, particles are generated in the process of the wafer transfer so as to lower the manufacturing yield of the semiconductor device.

It should also be noted that the metal such as copper, which is buried in the damascene wiring, degrades the semiconductor substrate and contaminates the manufacturing machine during the manufacturing process of the semiconductor device so as to greatly damage the manufacturing line of the semiconductor device.

In order to manufacture an SOC of a high degree of integration and a high performance with a high manufacturing yield, it is absolutely necessary to develop a method of suppressing the particle generation in the peripheral portion and beveled portion of semiconductor wafer with a smaller number of manufacturing steps and of suppressing the contamination with the metal such as copper buried in the damascene wiring groove. The conventional method of manufacturing a semiconductor device, which is intended to overcome the problems noted above, will now be described with reference to the accompanying drawings.

In the manufacturing process of a semiconductor device having uneven portions, the problems described in the following were generated in the peripheral portion and the beveled portion of the semiconductor wafer. The particular problems will now be described in detail, with the etching step of the trench for the trench capacitor taken as an example.

In the manufacturing process of a trench capacitor shown in FIGS. 1A to 1C, a silicon nitride film 2 and a silicon oxide film 3 are successively formed first on a silicon wafer 1 by using a hot-wall type CVD machine as shown in FIG. 1A, followed by forming a resist pattern 4 in predetermined positions of the silicon oxide film 3. It should be noted that a resist 5, which should not remain originally, remains unremoved in some cases in a peripheral portion 1a and a beveled portion 1b of the silicon wafer 1 after formation of the resist pattern 4.

In the next step, the silicon oxide film 3, the silicon nitride film 2 and the silicon wafer 1 are removed successively and selectively by an anisotropic RIE (Reactive Ion Etching) with the resist pattern 4 used as a mask so as to form a trench 6 used for forming a capacitor. In this step, the resist 5 remaining in the peripheral portion 1a and the beveled portion 1b acts as an etching mask. In addition, the material formed by the etching is attached to the peripheral portion 1a and the beveled portion 1b of the silicon wafer 1 so as to act as an etching mask. Such being the situation, an irregular uneven portion 7 is generated in the peripheral portion 1a and the beveled portion 1b of the silicon wafer 1.

The irregular uneven portion 7 also takes place in the case where the plasma in the RIE step fails to reach sufficiently the peripheral portion of the wafer so as to cause the etching of the silicon oxide film 3 and the silicon nitride film 2 to be insufficient, with the result that the remaining silicon oxide film 3 and the silicon nitride film 2 perform the function of the etching mask.

The irregular uneven portion 7 tends to be broken easily in the process of transferring the wafer to and from the wafer carrier so as to cause the particle generation and, thus, to lower the manufacturing yield of the semiconductor device. Naturally, it is necessary to remove the irregular uneven portion 7. Such being the situation, the irregular uneven portion 7 formed in the peripheral portion and the beveled portion is removed in the next step.

Specifically, the device region is protected first by forming a resist pattern 4 in a manner to cover the trench 6 formed on the main surface of the silicon wafer 1 except the peripheral portion 1a and the beveled portion 1b, as shown in FIG. 1B, followed by applying a RIE treatment under the etching conditions in which the etching selectivity ratio of the silicon oxide film 3, the silicon nitride film 2 and the silicon wafer 1 is set at 1:1:1, thereby removing the tip portion of the irregular uneven portion 7 and the upper structure.

Then, the silicon wafer exposed to the peripheral portion 1a and the beveled portion 1b is removed by a wet etching so as to smooth the surfaces of the peripheral portion 1a and the beveled portion 1b of the silicon wafer 1 as shown in FIG. 1B, followed by removing the resist pattern 4, thereby finishing the removing step of the irregular uneven portion 7.

In the subsequent step of forming a trench capacitor, an impurity is introduced into the inner wall of the trench so as to form a silicon oxynitride film as a capacitor dielectric film. Then, a polycrystalline silicon (polysilicon) film 8 forming a storage electrode is formed to fill the trench, followed by planarizing the surface of the polysilicon film 8 by a CMP (Chemical Mechanical Polishing) method, as shown in FIG. 1C.

As described above, for the removal of the irregular uneven portion, it is necessary to employ at least the four steps of the resist pattern formation, the RIE etching, the wet etching, and the removal of the resist. Naturally, the step of removing the uneven portion causes a low through-put and a high manufacturing cost and, thus, constitutes a serious problem that must be solved.

The problem generated in the edge portion of the semiconductor wafer in the process of forming a damascene wiring by using copper as a filled metal will now be described. FIGS. 2A to 2C collectively show the problem inherent in the conventional process of forming a damascene wiring by using copper.

As shown in FIG. 2A, a resist pattern (not shown) is formed on a silicon oxide film 9 after formation of the silicon oxide film 9 on a silicon wafer 1, followed by removing the silicon oxide film 9 by employing an anisotropic RIE treatment. Then, the resist pattern is removed, followed by forming a wiring trench 10 in the silicon oxide film 9. In the next step, a barrier metal (not shown) consisting of a TaN film and a Cu film is formed by means of a sputtering method, followed by depositing a Cu layer 11, which is buried in the wiring trench 10, by means of a plating method.

In the process of forming the barrier metal by the sputtering method, the TaN film and the Cu film are formed on the silicon oxide film covering the peripheral portion 1a and the beveled portion 1b of the silicon wafer 1 as well as on the inner surface of the wiring trench 10 and the upper surface of the silicon oxide film 9. Further, a Cu layer 11 is deposited on the Cu film. For the simplicity, the TaN film and the Cu film are collectively denoted as the single Cu layer 11 in FIG. 2A.

In the next step, a CMP treatment is applied to the TaN film and the Cu film formed by the sputtering method and to the Cu layer 11 formed by the plating method so as to remove the excess portions of the TaN film, the Cu film and the Cu layer 11 positioned on the silicon oxide film 9 so as to planarize the surface and, thus, to form a Cu filled metallization.

In the next step, an interlayer insulating film 12 formed of a laminate structure consisting of a silicon nitride film and a silicon oxide film is formed as shown in FIG. 2C in order to form an upper wiring layer. Incidentally, the interlayer insulating film 12 is depicted as a single insulating film in FIG. 12 for the sake of brevity.

However, since the interlayer insulating film 12 consisting of the silicon nitride film and the silicon oxide film is formed in general by using a plasma CVD method, the interlayer insulating film 12 fails to cover the entire edge portion of the silicon wafer 1, with the result that the Cu layer 11 is exposed to the edge portion of the silicon wafer 1.

It should be noted that, if the silicon wafer 1 having the Cu layer 11 exposed in the edge portion is introduced into a resist coating machine or an exposure machine in the subsequent lithography step, the Cu layer 11 exposed to the outside in the edge portion contaminates the wafer transfer system.

It should also be noted that, in the subsequent step of etching the interlayer insulating film 12 by employing an anisotropic RIE treatment using a resist pattern as a mask, the Cu layer 11 exposed in the edge portion is exposed to the plasma of RIE so as to contaminate the RIE chamber. At the same time, the silicon wafer 1 itself is contaminated with Cu.

Further, if the resist pattern is removed in the next step by using an oxygen plasma asher, the Cu layer 11 exposed to the edge portion is oxidized, with the result that the chamber of the asher and the silicon wafer 1 are contaminated with Cu. At the same time, the Cu layer 11 oxidized in the edge portion of the silicon wafer 1 is rendered brittle so as to cause a particle generation. Therefore, a serious problem is generated that the residue of the Cu layer 11 in the edge portion of the silicon wafer 1 provides a source of contamination of the processing machine and the silicon wafer. In the manufacturing process of a semiconductor device, there are various sources of contamination including, for example, PZT ($Pd(Zr,Ti)O_3$) dielectric film in the FeRAM (Ferroelectric Random Access Memory) and the Ru stacked electrode in a stacked capacitor in addition to Cu in the damascene wiring.

As described above, at least four steps were required in the conventional process for removing the uneven portion formed in the peripheral portion and the beveled portion of the silicon wafer, leading to a long period required for the manufacture of a semiconductor device and to a high manufacturing cost.

It should also be noted that, in the manufacturing process of a damascene wiring using Cu, Cu is exposed to the edge portion of the silicon wafer. When the silicon wafer having the exposed Cu is introduced into a resist coating apparatus or a light exposure apparatus in the lithography step, a serious problem is generated that the transfer system of these apparatuses is contaminated with Cu.

Further, when the resist pattern is removed by using an etching mask in the processing of the interlayer insulating film in the upper wiring layer, the Cu exposed to the edge portion is oxidized, with the result that the chamber of the oxygen plasma asher and the silicon wafer itself are contaminated with Cu. In addition, the oxidized Cu produces a serious problem if generating particles causing a low yield.

BRIEF SUMMARY OF THE INVENTION

An embodiment of the present invention is to provide a method of manufacturing a semiconductor device, which permits easily removing a deep uneven portion generated in the peripheral portion and the beveled portion of a target substrate including a semiconductor substrate, permits shortening the manufacturing period of the semiconductor device, and also permits lowering the manufacturing cost of the semiconductor device.

Another embodiment the present invention is to provide a method of manufacturing a semiconductor device, which permits preventing the metal layer for the buried wiring from being exposed to the edge portion of a target substrate including a semiconductor substrate, permits preventing the manufacturing apparatus and the target substrate from being contaminated by the metal layer, and also permits suppressing the particle generation.

A simple grinding or polishing step is introduced into the method of the present invention for manufacturing a semiconductor device so as to achieve the first and second objects noted above so as to facilitate the manufacturing process of a semiconductor device such as an SOC having an uneven portion.

According to a first aspect of the present invention, there is provided a method of manufacturing a semiconductor device in which a semiconductor element is formed in a semiconductor substrate, including a step of selectively grinding or polishing the peripheral portion and the beveled portion on the side of the main surface of a target substrate including a semiconductor substrate.

The step of selectively grinding or polishing the peripheral portion and the beveled portion on the side of the main surface of the target substrate is carried out after a step of forming an uneven portion in the target substrate.

Also, the step of selectively grinding or polishing the peripheral portion and the beveled portion on the side of the main surface of the target substrate is carried out in some cases after at least one additional step following the step of forming an uneven portion in the target substrate.

Preferably, the step of selectively grinding or polishing the peripheral portion and the beveled portion on the side of the main surface of the target substrate might be carried out after a step of covering the main surface of the target substrate with a resist film, the step being carried out after the step of forming an uneven portion in the target substrate.

Preferably, the step of selectively grinding or polishing the peripheral portion and the beveled portion on the side of the main surface of the target substrate might be carried out after a step of forming a film of a material providing a source of contamination of the processing machine for applying a predetermined processing to the target substrate including the semiconductor substrate or providing a source of contamination of the semiconductor substrate.

According to a second aspect of the present invention, there is provided a method of manufacturing a semiconductor device comprising: applying an anisotropic dry etching treatment to form an uneven portion in a target substrate including a semiconductor substrate; and selectively grinding or polishing the peripheral portion and the beveled portion on the side of the main surface of the target substrate including the semiconductor substrate.

According to a third aspect of the present invention, there is provided a method of manufacturing a semiconductor device comprising: a first step of forming an insulating film on a semiconductor substrate; a second step of applying an anisotropic etching to the insulating film and the semiconductor substrate so as to form a trench in the semiconductor substrate; a third step of depositing a polysilicon film in a manner to cover the main surface of the semiconductor substrate including the inner surface of the trench; grinding or polishing the peripheral portion and the beveled portion on the side of the main surface of the semiconductor substrate covered with the polysilicon film; and a fourth step of polishing the polysilicon film with the insulating film used as a stopper.

According to a fourth aspect of the present invention, there is provided a method of manufacturing a semiconductor device comprising: a first step of forming a first insulating film on a semiconductor substrate; a second step of etching the first insulating film to form a trench in the first insulating film; a third step of forming a barrier metal layer on the upper surface of the first insulating film and on the inner surface of the trench; a fourth step of depositing a metal layer in a manner to cover the main surface side of the semiconductor substrate with the barrier metal layer interposed therebetween; a fifth step of grinding or polishing the peripheral portion and the beveled portion on the side of the main surface of the semiconductor substrate covered with the metal layer; a sixth step of polishing the first insulating film with the metal layer used as a stopper so as to remove the metal layer and the barrier metal layer on the upper surface of the first insulating film so as to planarize the surface; and a seventh step of forming a second insulating film in a manner to cover the upper surface of the first insulating film and the upper surface of the metal layer.

It is desirable for the metal layer to be a Cu layer deposited by employing a plating process.

According to a fifth aspect of the present invention, there is provided a method of manufacturing a semiconductor device comprising: forming an insulating film on a semiconductor substrate; selectively etching the insulating film to form a trench in the insulating film; forming a film containing a contaminant material formed in the manufacturing step of the semiconductor device; and grinding or polishing the peripheral portion and the beveled portion on the side of the main surface of the semiconductor substrate covered with the film containing the contaminant material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3G are cross sectional views showing a manufacturing method of a semiconductor device according to a first embodiment of the present invention;

DETAILED DESCRIPTION OF THE INVENTION

Figure 1A:
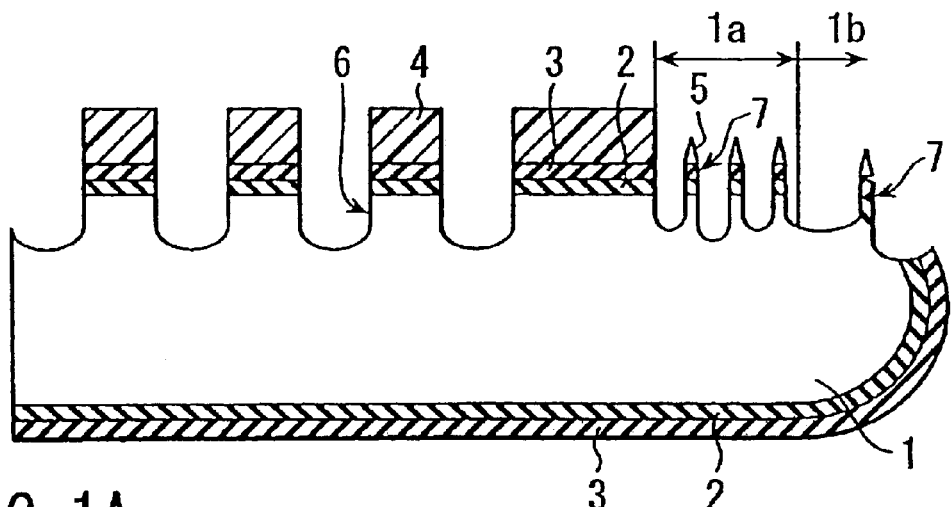
FIGS. 1A to 1C are cross sectional views collectively showing a conventional method of manufacturing a semiconductor device having a trench capacitor.

Some embodiments of the present invention will now be described with reference to the accompanying drawings.
<First Embodiment>

A first embodiment of the present invention will now be described with reference to FIGS. 3A to 3G. The first embodiment is directed to the manufacturing method of a semiconductor device having an uneven portion as an example of the manufacturing process of a trench capacitor. FIGS. 3A to 3G are cross sectional views collectively showing a part of the manufacturing process of a trench capacitor according to the first embodiment of the present invention.

In the first step, a silicon nitride film 2 and a silicon oxide film 3 are formed successively on the surface of a silicon wafer 1 by using, for example, a CVD apparatus of a hot-wall type, as shown in FIG. 3A.

In the next step, the upper surface of the silicon oxide film 3 is coated with a resist film, followed by applying a light exposure and development so as to form a resist pattern 4 used as an etching mask in the step of forming a trench. In this step, it is possible for a resist pattern 5 of a fine and irregular shape to remain in a region in which the resist pattern should not be formed originally, i.e., in a peripheral portion 1a and a beveled portion 1b of the silicon wafer 1.

After formation of the resist pattern 4, the silicon oxide film 3, the silicon nitride film 2 and the silicon wafer 1 are successively removed selectively by means of an anisotropic RIE treatment with the resist pattern 4 used as a mask so as to form a trench 6 for a trench capacitor, as shown in FIG. 3C. In this step, the resist pattern 5 of the fine and irregular shape remaining in the peripheral portion 1a and the beveled portion 1b on the side of the main surface of the silicon wafer 1 acts as an etching mask. Also, the material resulting from the etching is attached to the peripheral portion 1a and the beveled portion 1b of the silicon wafer 1 so as to produce the function of the etching mask. As a result, an uneven portion 7 is formed as shown on the right-hand portion of FIG. 3C.

The uneven portion 7 is also formed in the case where the plasma of RIE fails to reach sufficiently the peripheral portion 1a and the beveled portion 1b of the silicon wafer 1, resulting in failure to achieve sufficiently the RIE etching of the silicon oxide film 3 and the silicon nitride film 2 so as to allow the silicon oxide film 3 and the silicon nitride film 2 remaining on the surface of the silicon wafer 1 to act as the etching mask of the silicon wafer 1.

Figure 3E:
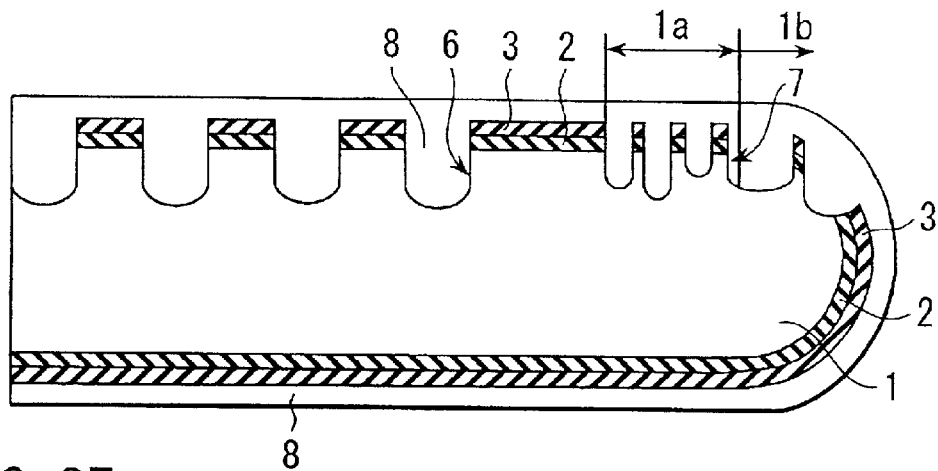

After removal of the resist patterns 4 and 5, an impurity is introduced into the inner wall of the trench 6 as shown in FIG. 3D so as to form a silicon oxynitride film (not shown) as a dielectric film of a trench capacitor, followed by depositing a polysilicon film 8 to fill the trench 6, as shown in FIG. 3E. In this step, the uneven portion 7 formed in the peripheral portion 1a and the beveled portion 1b of the silicon wafer 1 is also filled with the polysilicon film 8.

Figure 3F:
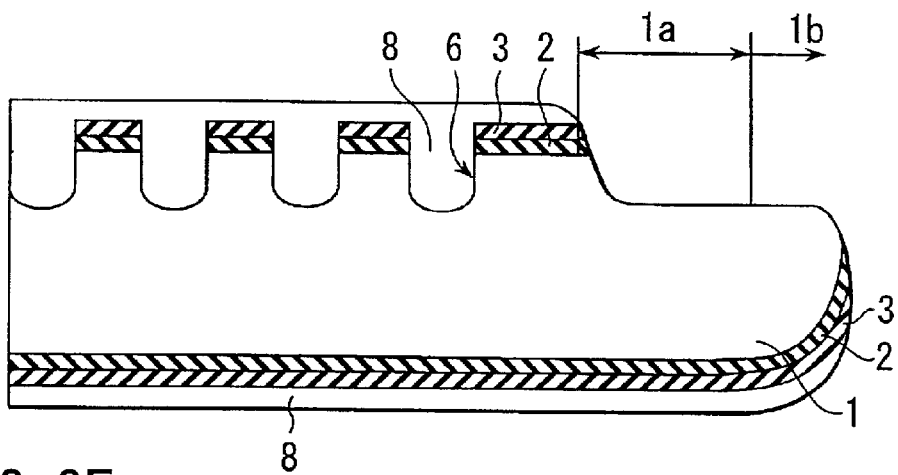

In the next step, a grinding or a polishing, e.g., CMP, is applied to the peripheral portion 1a and the beveled portion 1b on the side of the main surface of the silicon wafer 1 so as to remove the uneven portion 7 buried in the polysilicon film 8, as shown in FIG. 3F. In this case, the polysilicon film 8 acts as a protective film so as to prevent the slurry used in the grinding or polishing step from entering the trench 6, with the result that the washing after the grinding or polishing treatment can be carried out easily.

Further, a CMP treatment is applied to the polysilicon film 8 as in the ordinary polishing process so as to remove the polysilicon film 8 deposited on the surface of the silicon wafer 1 so as to planarize the surface, thereby forming a stacked electrode of a trench capacitor.

In the manufacturing process of the trench capacitor described above, the deep uneven portion in the peripheral portion and the beveled portion of the silicon wafer can be removed by a single step of simply grinding or polishing the peripheral portion 1a and the beveled portion 1b on the side of the main surface of the silicon wafer 1. It follows that the manufacturing process can be markedly shortened in the present invention, compared with the conventional method requiring the four steps of the resist pattern formation, the RIE etching, the wet etching and the removal of the resist, which are required for removing the uneven portion.

Figure 4A:
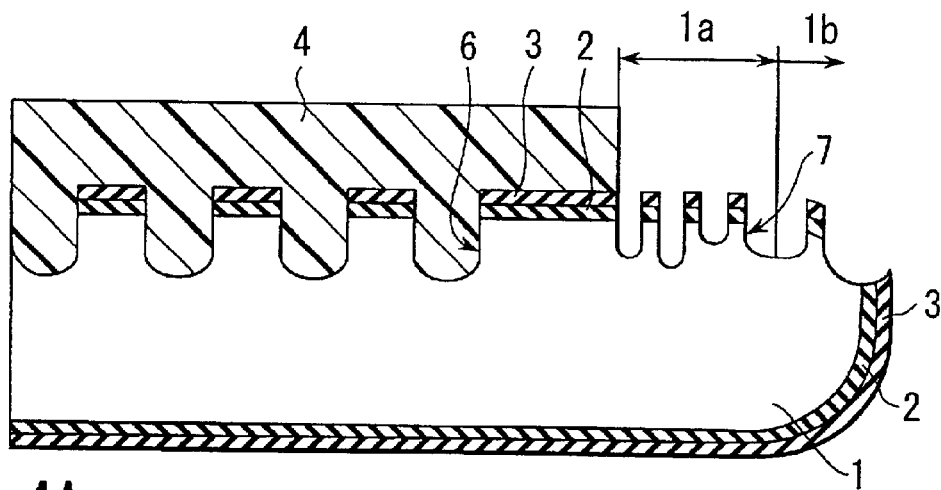
FIGS. 4A to 4C are cross sectional views collectively showing the protecting process of a trench with a resist film.
Figure 4B:
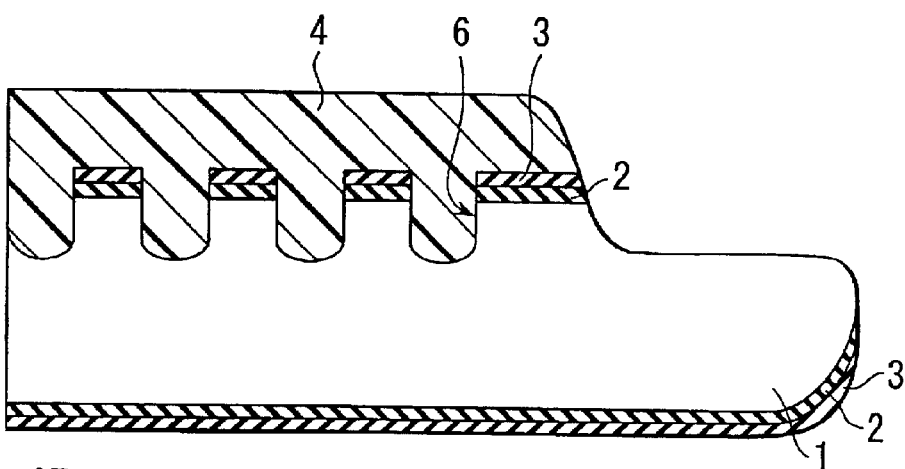
Figure 4C:
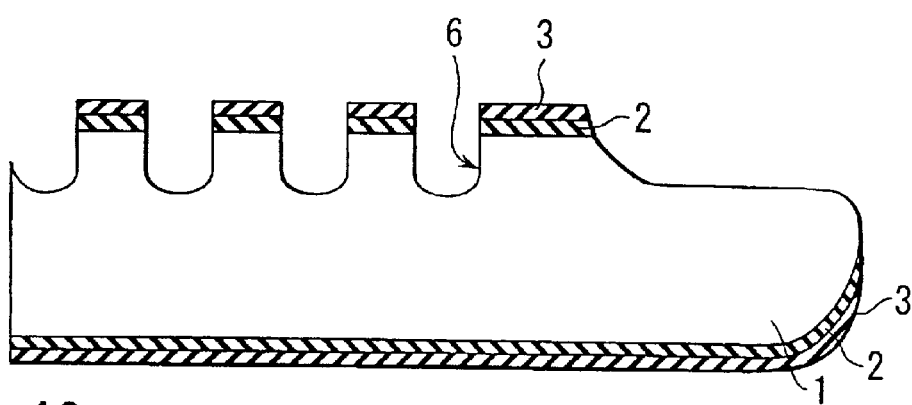

A modification of the first embodiment of the present invention will now be described with reference to FIGS. 4A to 4C. In the first embodiment of the present invention, as shown in FIG. 3D, an impurity is introduced into the inner wall of the trench 6 after generation of the deep uneven portion 7 in the peripheral portion 1a and the beveled portion 1b of the silicon wafer 1 so as to form a silicon oxynitride film as a dielectric film of the trench capacitor, as described previously. What should be noted is that, in this step, the deep uneven portion 7 tends to be broken easily and, thus, it is worried about that the silicon oxynitride film may be made defective by the mixing of the particle. In order to overcome the difficulty, the trench 6 is protected by using the resist pattern 4 as shown in FIG. 4A, followed by applying a grinding or polishing treatment, e.g., CMP treatment, to the peripheral portion 1a and the beveled portion 1b on the side of the main surface of the silicon wafer 1 so as to remove the uneven portion 7, as shown in FIG. 4B. Then, the resist pattern is removed, as shown in FIG. 4C. The particular process shown in FIGS. 4A to 4C permits forming the trench capacitor with a high yield.

It should be noted that the process required for removing the uneven portion in the peripheral portion and the beveled portion of the silicon wafer 1 comprises only three steps of the resist pattern formation, the grinding or polishing treatment applied to the peripheral portion 1a and the beveled portion 1b on the side of the main surface of the silicon wafer 1, and the removal of the resist pattern.

Figure 1B:
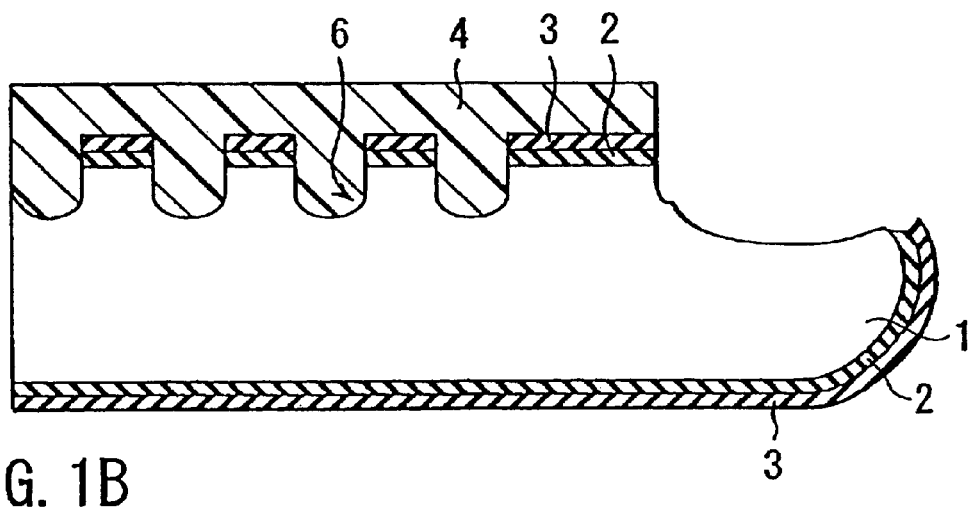

Compared with the conventional process of removing the uneven portion, which requires four steps, the modified method of the present invention described above permits omitting only one step. In the conventional process of removing the uneven portion, however, a small wavy unevenness is left unremoved after removal of the uneven portion as shown in FIG. 1B. In the removing process of the uneven portion according to the modification of the first embodiment of the present invention, however, the uneven portion is planarized by the grinding or polishing treatment, making it possible to obtain the peripheral portion and the beveled portion, which are smoother, of the silicon wafer.

In the modification of the first embodiment described above, a resist pattern is used for protecting the trench. However, it is not absolutely to form a patterned resist layer. It is also possible to apply a spin coating of resist to the entire surface of the silicon wafer, followed by baking the resist film. In this case, the peripheral portion and the beveled portion of the silicon wafer can be subjected to the grinding or polishing treatment by using the baked resist film as it is so as to planarize the uneven portion.

The number of particles was evaluated as follows in order to confirm the effect of suppressing the particle generation in the step of removing the uneven portion according to the first embodiment of the present invention.

Specifically, 25 samples were prepared for each kind of the silicon wafers as follows:

(1) A silicon wafer having the uneven portion 7 as shown in FIG. 3D.

Figure 1C:
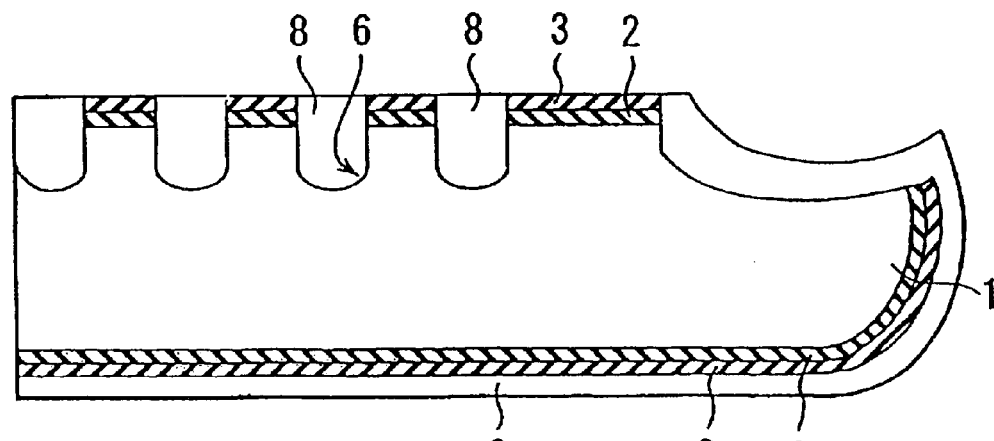
Figure 2A:
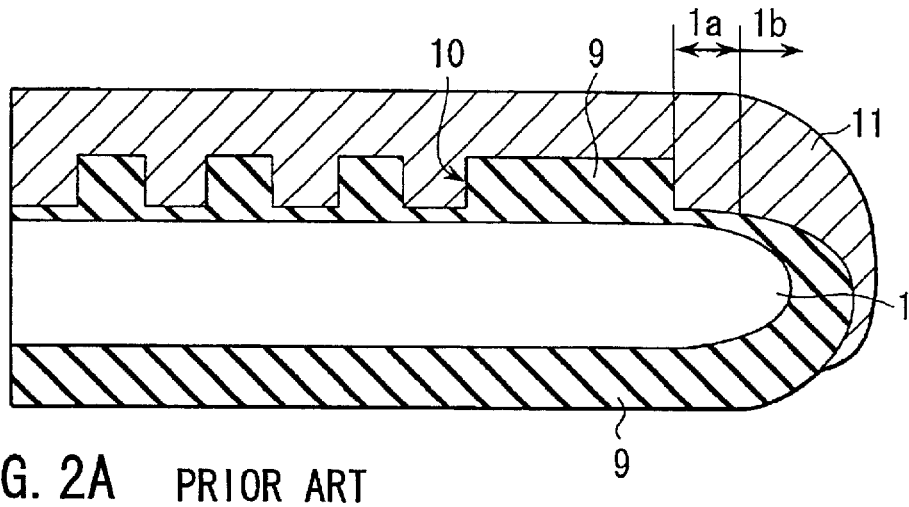
FIGS. 2A to 2C are cross sectional views collectively showing a conventional method of manufacturing a semiconductor device having a Cu-buried wiring.
Figure 2B:
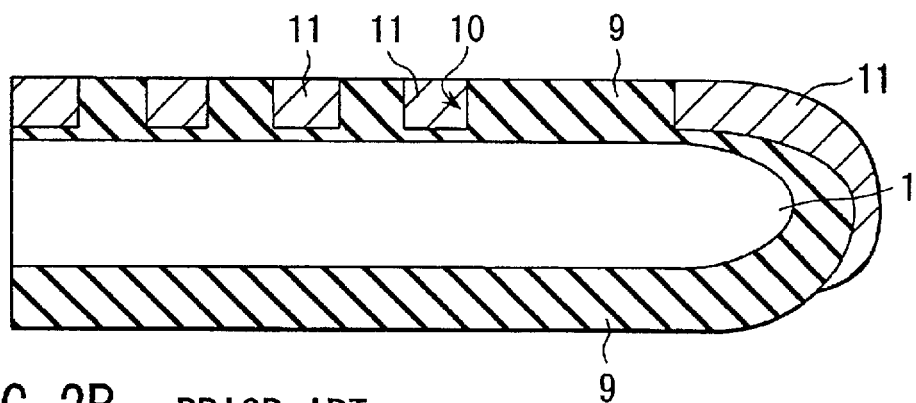
Figure 2C:
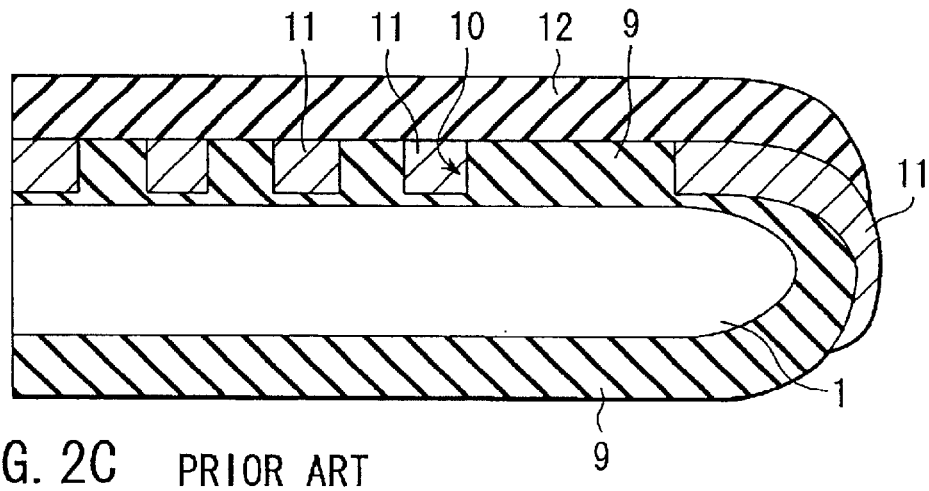

(2) A silicon wafer processed by the conventional method. Specifically, the uneven portion 7 was removed from the silicon wafer by the four steps of the resist pattern formation, the RIE etching, the wet etching, and the removal of the resist film, as shown in FIG. 1C. Then, the polysilicon film 8 was planarized by a CMP treatment as shown in FIG. 1C.

Figure 3G:
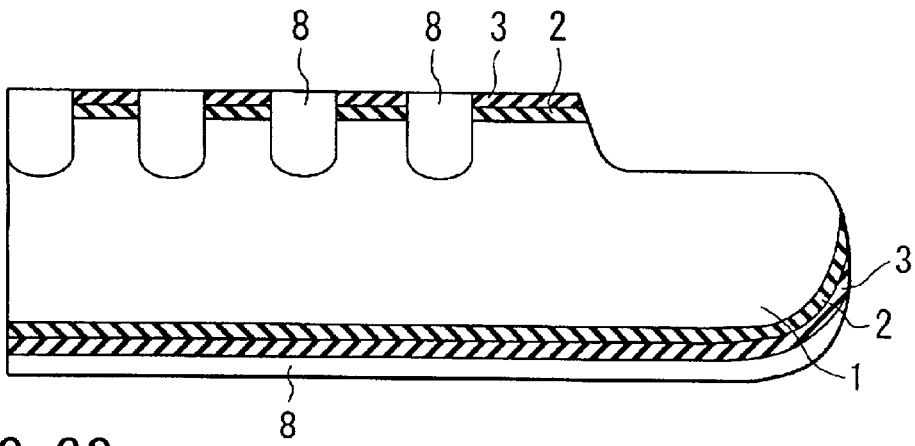

(3) A silicon wafer was processed by the method according to the first embodiment of the present invention. Specifically, the peripheral portion 1a and the beveled portion 1b of the silicon wafer 1 were polished so as to remove the uneven portion 7 by a single step, as shown in FIG. 3F. Then, the surface was planarized by applying a CMP treatment to the polysilicon film 8, as shown in FIG. 3G.

All the samples of the silicon wafer were housed in a first cassette. Then, the operation of transferring all the wafers one by one from the first cassette into a second cassette was repeated 10 times by using a wafer transfer robot. To be more specific, the silicon wafer inserted into slot 1 (lowermost slot) of the first cassette was transferred into slot 25 (uppermost slot) of the second slot, followed by transferring the silicon wafer inserted into slot 2 of the first cassette into slot 24 of the second cassette. In this fashion, all the silicon wafers within the first cassette were transferred into the second cassette. After the operation of transferring all the wafers within the first cassette into the second cassette was repeated 10 times, the increase in the number of particles having a diameter not smaller than 0.2 μm, which were present on the silicon wafer, was counted.

It has been found that the number of particles increased by the transfer operation was 326 on the average when it comes to sample (1), i.e., the silicon wafer having the uneven portion. The number of particles increased by the transfer operation was decreased to 22 on the average when it comes to sample (2), i.e., the silicon wafer in which the uneven portion was removed by the conventional method. On the other hand, number of particles increased by the transfer operation was decreased to only 3 on the average when it comes to sample (3), i.e., the silicon wafer in which the uneven portion was removed by the method according to the first embodiment of the present invention.

The experimental data clearly support that the number of particles is markedly increased by the transfer operation when it comes to the silicon wafer having the uneven portion, that the number of particles is also increased when it comes to the silicon wafer having a small wavy uneven portion even if the uneven portion is removed by the conventional method, and that the number of particles is scarcely increased when it comes to the silicon wafer in which the polishing was applied by the method according to the first embodiment of the present invention so as to permit the silicon wafer to have a smooth peripheral portion and a smooth beveled portion.

It has been clarified that, in the case where a small wavy unevenness is left unremoved in the peripheral portion and the beveled portion of the silicon wafer even if the main uneven portion is removed as in the conventional method, the small wavy uneven portion causes the particle generation. Therefore, where such a small uneven portion is generated during the manufacturing process of the semiconductor device, it is effective in suppressing the particle generation to polish the peripheral portion and the beveled portion of the silicon wafer so as to smooth these peripheral portion and the beveled portion.

As described previously in conjunction with the modification of the first embodiment of the present invention, the trench is protected with a resist pattern as shown in FIG. 4A, followed by polishing the peripheral portion 1a and the beveled portion 1b of the silicon wafer 1 so as to remove the uneven portion 7, as shown in FIG. 4B. Further, the resist is removed. In the case of employing the removing method of the uneven portion comprising the three steps noted above, the peripheral portion and the beveled portion of the silicon wafer are smoothed by the polishing, with the result that the particle generation is scarcely recognized.

To reiterate, the conventional method of removing the uneven portion comprises four steps of the resist pattern formation, the RIE etching, the wet etching, and the removal of the resist pattern. In the method of the present invention, however, the two steps of the RIE etching and the wet etching employed in the conventional method can be replaced by a cheap polishing step, leading to a low manufacturing cost of the semiconductor device.

As described above, it is possible for the removing step of the uneven portion according to the first embodiment of the present invention and the modification thereof to be performed immediately after the step in which the uneven portion is generated or to be performed after the constituting portion of the element is protected with, for example, a resist film. Also, in the manufacturing method of a semiconductor device of a complex structure such as an SOC, it is desirable in some cases to carry out the removing step of the uneven portion after a series of process steps carried out after the step in which the uneven portion is generated.

<Second Embodiment>

A second embodiment of the present invention will now be described with reference to FIGS. 5A to 5G. The second embodiment is directed to the manufacturing process of a damascene wiring using copper and deals with the measure for preventing the contamination with copper, which is generated in the edge portion of the silicon wafer.

Figure 5A:
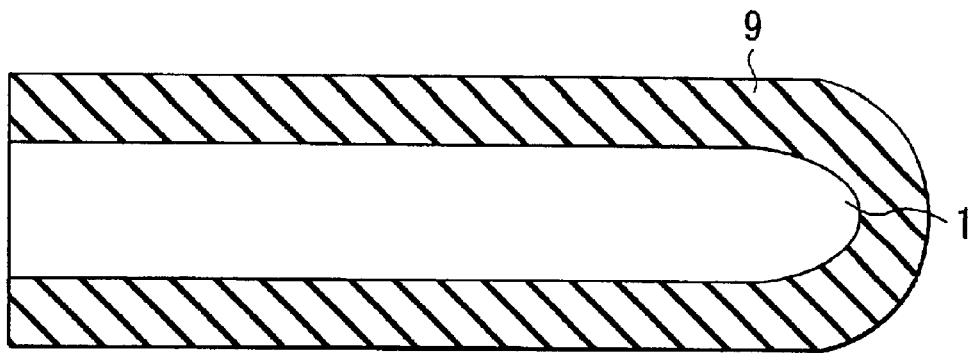
FIGS. 5A to 5G are cross sectional views showing a manufacturing method of a semiconductor device according to a second embodiment of the present invention.
Figure 5B:
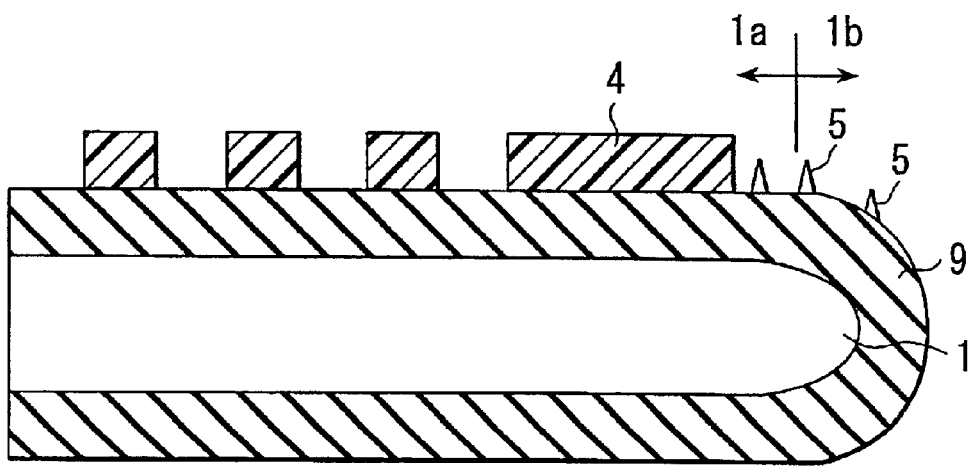

FIGS. 5A to 5G are cross sectional views collectively showing a part of the manufacturing process of Cu-buried wiring according to the second embodiment of the present invention. In the first step, a silicon oxide film 9 is formed on a silicon wafer 1, as shown in FIG. 5A, followed by forming a resist pattern 4 for forming a wiring trench in the silicon oxide film 9, as shown in FIG. 5B. After formation of the resist film, it is possible for a fine irregular resist pattern 5 to remain unremoved in the region where the resist pattern should not be formed originally, i.e., in the peripheral portion 1a and the beveled portion 1b on the side of the main surface of the silicon wafer 1.

Figure 5C:
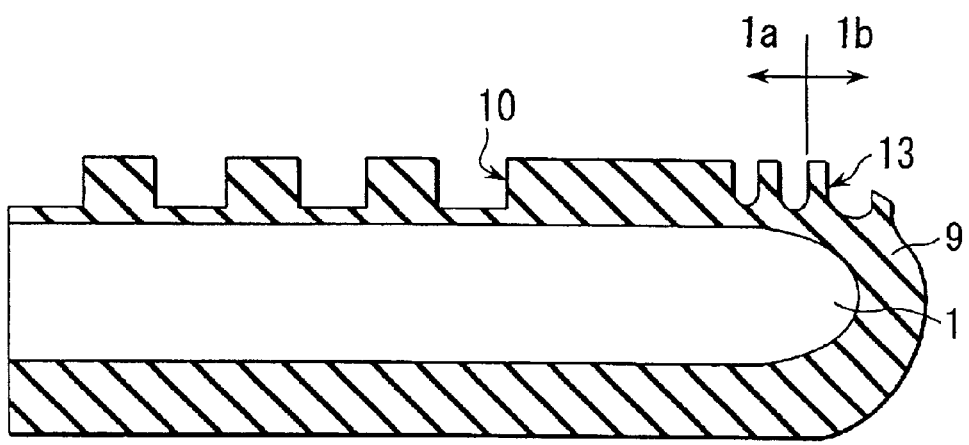

In the next step, the silicon oxide film 9 is removed by applying an anisotropic etching with the resist pattern 4 used as a mask so as to form a wiring trench 10 as shown in FIG. 5C. In this step, the fine and irregular resist pattern 5 remaining in the peripheral portion 1a and the beveled portion 1b of the silicon wafer 1 act as a mask so as to form an uneven portion 13, as shown in FIG. 5B.

The uneven portion 13 shown in FIG. 5C is formed shallower than an uneven portion 7 that is generated in the step of forming a trench capacitor, as shown in FIG. 3D. In addition, the uneven portion 13 consists of the silicon oxide film 9 alone. It follows that the uneven portion 13 is unlikely to cause the particle generation derived from the peeling or cracking. However, where the peeling or cracking of the silicon oxide film 9 is generated as a problem that must be solved in the subsequent step, it is possible to remove easily the uneven portion 13 by employing, for example, the modification of the first embodiment described previously in conjunction with FIGS. 4A to 4C.

Figure 5D:
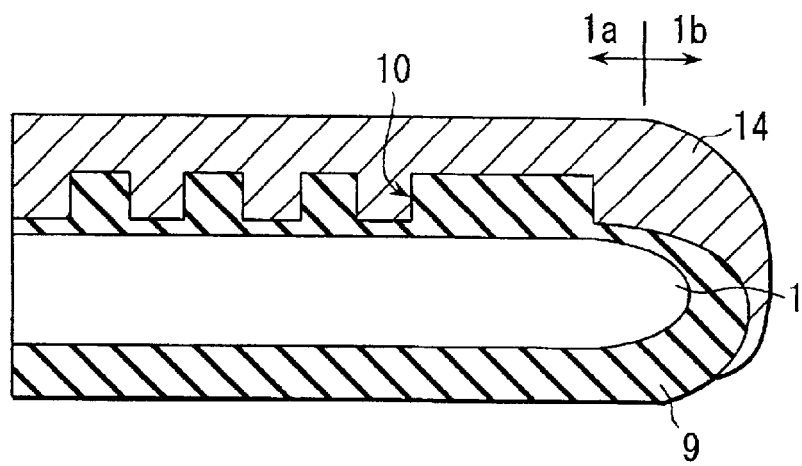
Figure 5E:
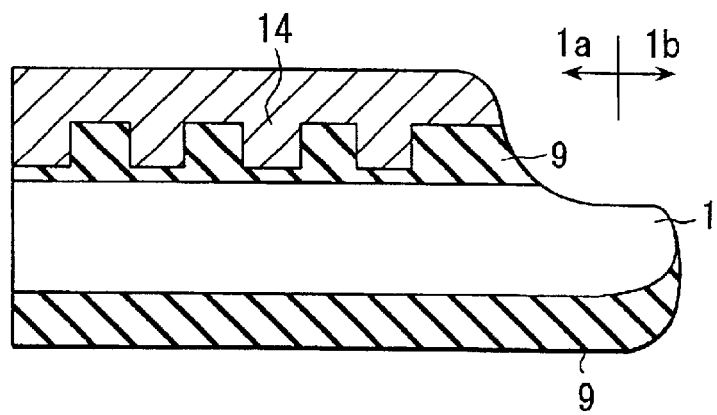
Figure 5F:
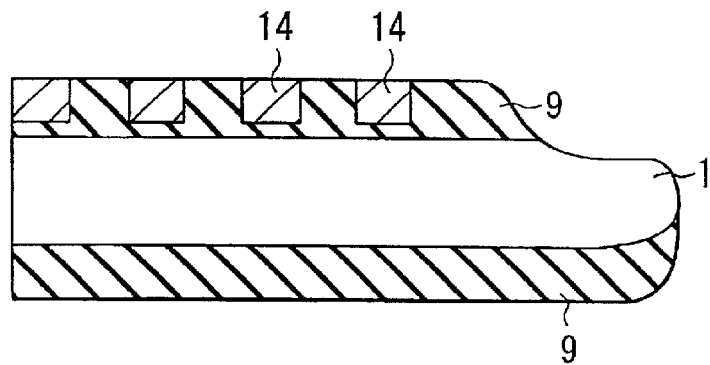

In the next step, a barrier metal (not shown) consisting of a TaN film and a Cu film is formed by a sputtering method, followed by forming a Cu layer 14, as shown in FIG. 5D. In forming the TaN film and the Cu film as a barrier metal, a TaN film and a Cu film 35 are also formed in the peripheral portion 1a and the beveled portion 1b of the silicon wafer 1, with the result that the Cu layer 14 is also formed in the peripheral portion 1a and the beveled portion 1b of the silicon wafer 1.

In the next step, a grinding or polishing treatment is applied to the peripheral portion 1a and the beveled portion 1b on the side of the main surface of the silicon wafer 1 so as to remove the TaN film and the Cu film formed by sputtering in the peripheral portion 1a and the beveled portion 1b of the silicon wafer 1 and the Cu layer 14 deposited on the Cu film by the plating. Further, the Cu film and the TaN film formed by a sputtering method on the silicon oxide film 9 and the Cu layer 14 deposited by the plating method are removed by a CMP method so as to planarize the wafer surface.

Figure 5G:
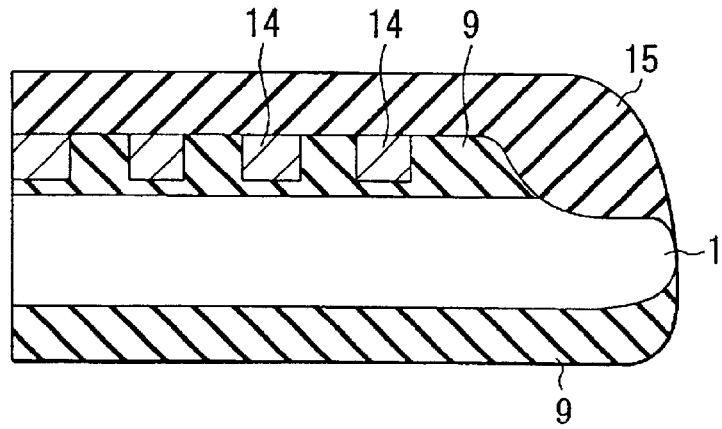

In the next step, an interlayer insulating film 15 consisting of a silicon nitride film and a silicon oxide film is formed by a plasma CVD method in order to form an upper wiring layer, as shown in FIG. 5G. Incidentally, the interlayer insulating film 15 consisting of a silicon nitride film and a silicon oxide film is shown as a single insulating film in FIG. 5G for the sake of brevity.

By the steps described above, it is possible to realize a buried wiring structure in which copper is not exposed to the outside in any of the front surface and back surface of the silicon wafer 1 and the peripheral portion and the beveled portion of the silicon wafer 1. Incidentally, FIG. 5D covers the case where the Cu layer 14 is deposited by means of plating after removal of the uneven portion 13 of the silicon oxide film 9. However, a substantially the same result can be obtained even if the Cu layer 14 is deposited with the uneven portion 13 left unremoved.

In the second embodiment described above, it is possible to avoid various types of contamination. To be more specific, it is possible to avoid the contamination of the resist coating apparatus and the light exposure apparatus in the subsequent lithography step for forming the upper wiring layer, the contamination of the etching chamber and the silicon wafer itself with copper in the subsequent RIE etching step of the oxide film, and the contamination of the process chamber and the silicon wafer in the subsequent resist removing step. In addition, it is possible to avoid, for example, the particle generation caused by the oxidized copper.

The second embodiment described above is directed to the problem of contamination with metal in the manufacturing process of a semiconductor device, with a damascene wiring using copper taken as an example. However, a similar problem also takes place in the manufacturing method of a semiconductor device, comprising the step of forming a metal film or a laminated metal film on the inner surface of the trench, said metal film being formed of a metal other than copper such as Ag, Ni, Co, Ru, Pd and Fe. For example, if the method of the second embodiment is applied in a modified fashion to the step of forming a stacked capacitor for an FeRAM using a Ru electrode and a PZT (containing Pb) dielectric film, it is possible to suppress the process contamination caused by the Ru film or the PZT dielectric film laminated on the Ru film.

As a modification of the second embodiment described above, it is possible to employ the step described below. In the first step, an insulating film is formed on a silicon wafer, followed by forming a patterned resist film on the insulating film. Then, the insulating film is etched with the patterned resist film used as a mask so as to form a trench in the insulating film as shown in FIG. 5D. In this case, it is possible for the trench to be tapered such that the diameter of the trench is increased upwardly.

After removal of the resist film, a film containing a contaminant material in the manufacturing process of the semiconductor device, said film corresponding to the barrier metal in the second embodiment, is formed on the upper surface of the insulating film and on the inner surface of the trench. Then, the step of grinding or polishing the peripheral portion and the beveled portion on the side of the main surface of the semiconductor substrate covered with the film containing the contaminant material is introduced without forming a thick plating layer, which corresponds to FIG. 5E for a barrier metal alone. Then, if the process proceeds to the next step of, for example, forming an interlayer insulating film (see FIG. 5G), it is possible to minimize the contamination in the manufacturing process caused by the film containing the contaminant material.

<Third Embodiment>

A third embodiment of the present invention will now be described with reference to FIG. 6. The third embodiment of the present invention is directed to the construction of the polishing apparatus used for grinding or polishing the peripheral portion and the beveled portion on the side of the main surface of the silicon wafer, which is referred to in each of the first and second embodiments described above.

Figure 6:
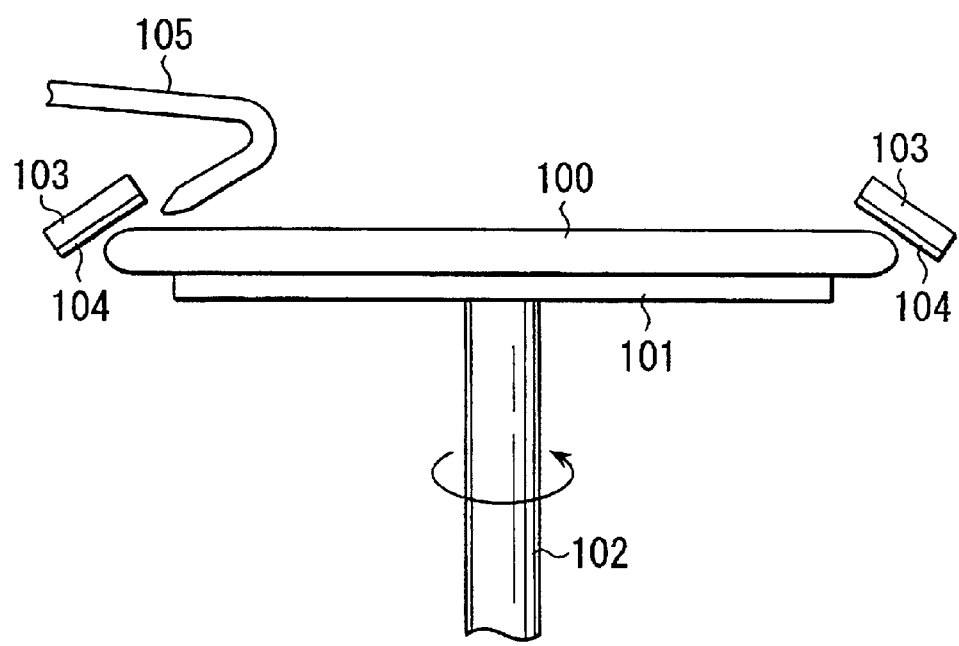
FIG. 6 is a view schematically showing the polishing apparatus used in the grinding or polishing step employed in the manufacturing process of the semiconductor device according to the present invention.

The polishing apparatus according to the third embodiment of the present invention, which is shown in FIG. 6, comprises a target substrate 100 including, for example, a silicon wafer, a base plate 101 to which the target substrate 100 is fixed by means of a vacuum chuck, a support rod 102 for rotating the base plate 101, a polishing plate 103 capable of fixation at an optimum polishing angle relative to the peripheral portion and the beveled portion on the side of the main surface of the target substrate 100, a polishing cloth 104 attached to the polishing plate 103, and a pipe 105 for supplying a slurry.

If a chemical material performing an etching function is mixed in the slurry, it is possible to polish the peripheral portion and the beveled portion on the side of the main surface of the target substrate 100 by a CMP method. Also, if a grinding agent is mixed in the slurry, it is possible to grind the peripheral portion and the beveled portion on the side of the main surface of the target substrate 100.

The polishing of the peripheral portion and the beveled portion of the silicon wafer described previously in conjunction with each of the first and second embodiments of the present invention is not necessarily limited to the polishing by a CMP method. It is also possible to employ the grinding or a combination of the polishing and the grinding.

Since it is possible to polish or grind easily the peripheral portion and the beveled portion on the side of the main surface of the target substrate including a silicon wafer in the case of using the polishing apparatus shown in FIG. 6, the contaminant material in the uneven portion of the target substrate and in the edge portion of the target substrate can be removed in a short time with the diameter of the silicon wafer left substantially unchanged. It follows that these treatments can be introduced freely into the manufacturing process of the semiconductor device without bringing about any inconvenience in the wafer transfer system of the manufacturing apparatus.

The present invention is not limited to the embodiments described above and can be embodied in variously modified fashions within the technical scope of the present invention.

As described above, according to the method of the present invention for manufacturing a semiconductor device, the uneven portion generated in the peripheral portion and the beveled portion of a target substrate including a semiconductor substrate can be removed promptly by grinding or polishing the peripheral portion and the beveled portion of the target substrate including a semiconductor substrate. It follows that the time required for the manufacturing process of the semiconductor device can be shortened, and the manufacturing cost can be lowered. It should also be noted that it is possible to avoid easily the exposure of the metal film causing the process contamination to the edge of the substrate by grinding or polishing the peripheral portion and the beveled portion of the target substrate including a semiconductor substrate.

It follows that the method of the present invention for manufacturing a semiconductor device can be employed for the manufacture of an SOC having a high degree of integration, in which trench capacitors are formed in a high density in a DRAM section and a fine damascene wiring of copper is used in the logic section. What should be noted is that the grinding or polishing step for suppressing the contamination of the process apparatus and the wafer as well as the generation of particles can be introduced freely in a complex process sequence of a high degree.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device in which a semiconductor element is formed in a semiconductor substrate, including selectively grinding or polishing the peripheral portion and the beveled portion on the main surface side of a target substrate including a semiconductor substrate, wherein a film formed on the peripheral portion and the beveled portion is removed under a condition that the film has non-selectivity to the target substrate, said selectively grinding or polishing the peripheral portion and the beveled portion on the main surface side of the target substrate is carried out after applying anisotropic dry etching treatment to form a deep and irregular uneven portion in the peripheral portion and the beveled portion of the target substrate.

2. The method of manufacturing a semiconductor device according to claim 1, wherein selectively grinding or polishing the peripheral portion and the beveled portion on the main surface side of the target substrate is carried out, after forming at least a surface protecting film on the main surface of the target substrate.

3. The method of manufacturing a semiconductor device according to claim 2, wherein the surface protecting film is a polysilicon film, and further comprising, after grinding or polishing the peripheral portion and the beveled portion, removing the polysilicon film on a portion of the main surface of the target substrate, which is other than the peripheral portion and the beveled portion, while remaining the polysilicon film in a trench formed in the substrate.

4. The method of manufacturing a semiconductor device according to claim 2, wherein the surface protecting film is a resist film, and further comprising, after grinding or polishing the peripheral portion and the beveled portion, removing the resist film on a portion of the main surface of the target substrate, which is other than the peripheral portion and the beveled portion.

5. The method of manufacturing a semiconductor device according to claim 1, wherein selectively grinding or polishing the peripheral portion and the beveled portion on the main surface side of the target substrate is carried out after covering a portion other than the peripheral portion and the beveled portion on the main surface of the target substrate with a resist film, selectively grinding or polishing the peripheral portion and the beveled portion being carried out following that the deep and irregular uneven portion is formed in the peripheral portion and the beveled portion of the target substrate.

6. The method of manufacturing a semiconductor device according to claim 1, wherein the anisotropic dry etching treatment is carried out so as to form a trench in the semiconductor substrate.

7. The method of manufacturing a semiconductor device according to claim 6, wherein the trench is used for forming a trench capacitor formed on the semiconductor substrate.

8. The method of manufacturing a semiconductor device according to claim 1, wherein selectively grinding or polishing the peripheral portion and the beveled portion is carried out, while remaining a diameter of said semiconductor substrate substantially unchanged, to remove the film formed on the peripheral portion and the beveled portion and deep and irregular uneven portion formed in the peripheral portion and the beveled portion.

9. The method of manufacturing a semiconductor device comprising:

forming an insulating film on a main surface of a semiconductor substrate;

applying an anisotropic etching to the insulating film and the semiconductor substrate so as to form a trench in the semiconductor substrate;

depositing a polysilicon film on the main surface of the semiconductor substrate and in the trench; and after depositing the polysilicon film, selectively grinding or polishing the peripheral portion and a beveled portion on the main surface side of the semiconductor substrate, wherein the insulating film remaining on the peripheral portion and the beveled portion is removed under a condition that the insulating film and the polysilicon film have non-selectivity to the semiconductor substrate.

10. The method of manufacturing a semiconductor device according to claim 9, further comprising, after grinding or polishing the peripheral portion and the beveled portion, removing the polysilicon film on a portion of the main surface of the target substrate, which is other than the peripheral portion and the beveled portion, while remaining the polysilicon film in the trench.

11. A method of manufacturing a semiconductor device in which a semiconductor element is formed in a semiconductor substrate, including selectively grinding or polishing the peripheral portion and the beveled portion on the main surface side of a target substrate including a semiconductor substrate, wherein at least an uppermost layer of multi-layered films formed on the peripheral portion and the beveled portion is removed under a condition that the at least uppermost layer of multi-layered films has non-selectivity to a layer of the multi-layered films which is under the at least uppermost layer of multi-layered films, said selectively grinding or polishing the peripheral portion and the beveled portion on the main surface side of the target substrate is carried out after applying anisotropic dry etching treatment to form a deep and irregular uneven portion in the peripheral portion and the beveled portion of the target substrate.

12. The method of manufacturing a semiconductor device according to claim 11, wherein selectively grinding or polishing the peripheral portion and the beveled portion on the main surface side of the target substrate is carried out, after forming at least a surface protecting film on the main surface of the target substrate.

13. The method of manufacturing a semiconductor device according to claim 12, wherein the surface protecting film is a polysilicon turn, and further comprising, after grinding or polishing the peripheral portion and the beveled portion, removing the polysilicon film on a portion of the main surface of the target substrate, which is other than the peripheral portion and the beveled portion, while remaining the polysilicon film in a trench formed in the substrate.

14. The method of manufacturing a semiconductor device according to claim 12, wherein the surface protecting film is a resist film, and further comprising, after grinding or polishing the peripheral portion and the beveled portion, removing the resist film remaining on a portion of the main surface of the target substrate, which is other than the peripheral portion and the beveled portion.

15. The method of manufacturing a semiconductor device according to claim 11, wherein selectively grinding or polishing the peripheral portion and the beveled portion on the main surface side of the target substrate is carried out after covering a portion other than the peripheral portion and the beveled portion on the main surface of the target substrate with a resist film, selectively grinding or polishing the peripheral portion and the beveled portion of the target substrate being carried out following that the deep and irregular uneven portion is formed in the peripheral portion and the beveled portion of the target substrate.

16. The method of manufacturing a semiconductor device according to claim 11, wherein the anisotropic dry etching treatment is carried out so as to form a trench in the semiconductor substrate.

17. The method of manufacturing a semiconductor device according to claim 16, wherein the trench is used for forming a trench capacitor on the semiconductor substrate.

18. The method of manufacturing a semiconductor device according to claim 11, wherein selectively grinding or polishing the peripheral portion and the beveled portion is carried out, while remaining a diameter of said semiconductor substrate substantially unchanged, to remove the film formed on the peripheral portion and the beveled portion and deep and irregular uneven portion formed in the peripheral portion and the beveled portion.

19. A method of manufacturing a semiconductor device in which a semiconductor element is formed in a semiconductor substrate, including selectively grinding or polishing the peripheral portion and the beveled portion on the main surface side of a target substrate including a semiconductor substrate, wherein multi-layered films formed on the peripheral portion and the beveled portion are removed under a condition that the multi-layered films have non-selectivity to the target substrate, said selectively grinding or polishing the peripheral portion and the beveled portion on the main surface side of the target substrate is carried out after applying anisotropic dry etching treatment to form a deep and irregular uneven portion in the peripheral portion and the beveled portion of the target substrate.

20. The method of manufacturing a semiconductor device according to claim 19, wherein selectively grinding or polishing the peripheral portion and the beveled portion on the main surface side of the target substrate is carried out, after forming at least a surface protecting film on the main surface of the target substrate.

21. The method of manufacturing a semiconductor device according to claim 20, wherein the surface protecting film is a polysilicon film, and further comprising after grinding or polishing the peripheral portion and the beveled portion, removing the polysilicon film remaining on a portion of the main surface of the target substrate, which is other than the peripheral portion and the beveled portion, while remaining the polysilicon fun in a trench formed in the substrate.

22. The method of manufacturing a semiconductor device according to claim 20, wherein the surface protecting film is a resist film, and further comprising after grinding or polishing the peripheral portion and the beveled portion, removing the resist film on a portion of the main surface of the target substrate, which is other than the peripheral portion and the beveled portion.

23. The method of manufacturing a semiconductor device according to claim 19, wherein selectively grinding or polishing the peripheral portion and the beveled portion on the main surface side of the target substrate is carried out after covering a portion other than the peripheral portion and the beveled portion on the main surface of the target substrate with a resist film selectively grinding or polishing the peripheral portion and the beveled portion being carried out following that the deep and irregular uneven portion is formed in the peripheral portion and the beveled portion of the target substrate.

24. The method of manufacturing a semiconductor device according to claim 19, wherein the anisotropic dry etching treatment is carried out so as to form a trench in the semiconductor substrate.

25. The method of manufacturing a semiconductor device according to claim 24, wherein the trench is used for forming a trench capacitor on the semiconductor substrate.

26. The method of manufacturing a semiconductor device according to claim 19, wherein selectively grinding or polishing the peripheral portion and the beveled portion is carried out, while remaining a diameter of said semiconductor substrate substantially unchanged, to remove the film formed on the peripheral portion and the beveled portion and deep and irregular uneven portion formed in the peripheral portion and the beveled portion.

* * * * *